(12) United States Patent
Li

(10) Patent No.: US 10,263,189 B2
(45) Date of Patent: Apr. 16, 2019

(54) ORGANIC ELECTROLUMINESCENT DEVICE AND MANUFACTURING METHOD THEREOF, AND DISPLAY APPARATUS

(71) Applicant: BOE TECHNOLOGY GROUP CO., LTD., Beijing (CN)

(72) Inventor: Yansong Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 18 days.

(21) Appl. No.: 14/415,924

(22) PCT Filed: Jun. 30, 2014

(86) PCT No.: PCT/CN2014/081117
§ 371 (c)(1),
(2) Date: Jan. 20, 2015

(87) PCT Pub. No.: WO2015/043265
PCT Pub. Date: Apr. 2, 2015

(65) Prior Publication Data
US 2016/0005971 A1    Jan. 7, 2016

(30) Foreign Application Priority Data
Sep. 29, 2013  (CN) .......................... 2013 1 0455386

(51) Int. Cl.
*H01L 51/00*    (2006.01)
*H01L 51/56*    (2006.01)
*H01L 51/50*    (2006.01)

(52) U.S. Cl.
CPC ...... *H01L 51/0029* (2013.01); *H01L 51/0003* (2013.01); *H01L 51/5016* (2013.01);
(Continued)

(58) Field of Classification Search
None
See application file for complete search history.

(56) References Cited

U.S. PATENT DOCUMENTS

2002/0067123 A1* 6/2002 Seki .................... H01L 51/0005
                                                            313/504
2005/0238799 A1* 10/2005 Seki .................... H01L 51/5012
                                                            427/66
(Continued)

FOREIGN PATENT DOCUMENTS

CN          1691849 A      11/2005
CN        101163359 A       4/2008
(Continued)

OTHER PUBLICATIONS

2nd office action issued in Chinese application No. 201310455386.0 dated Aug. 31, 2015.
(Continued)

*Primary Examiner* — Marc Anthony Armand
*Assistant Examiner* — Quinton A Brasfield
(74) *Attorney, Agent, or Firm* — Nath, Goldberg & Meyer; Joshua B. Goldberg

(57) ABSTRACT

The invention provides an organic electroluminescent device and a manufacturing method thereof, and a display apparatus. The method for manufacturing the organic electroluminescent device of the invention includes using the following to form at least one function layer: preparing a solution of a material of the function layer, and forming a liquid material layer for the function layer using the solution of the material of the function layer; performing a vacuum drying on the liquid material layer for the function layer to form function layer. In the invention, a relatively dense film is formed by performing a vacuum drying on the function layer, and the residual organic solvent is effectively removed to avoid the formation of defects, so that the film becomes smooth and dense, which increases the carrier mobility in the film and is advantageous to the transport and recombination of electrons and holes.

10 Claims, 2 Drawing Sheets

(52) U.S. Cl.
CPC ...... *H01L 51/5028* (2013.01); *H01L 51/5072* (2013.01); *H01L 51/5088* (2013.01); *H01L 51/5092* (2013.01); *H01L 51/5096* (2013.01); *H01L 51/56* (2013.01); *H01L 51/006* (2013.01); *H01L 51/0035* (2013.01); *H01L 51/0058* (2013.01); *H01L 51/0072* (2013.01); *H01L 51/0085* (2013.01)

(56) References Cited

U.S. PATENT DOCUMENTS

| | | | | |
|---|---|---|---|---|
| 2010/0194269 A1* | 8/2010 | Sonoda | ............... | H01L 27/3246 313/504 |
| 2011/0049498 A1* | 3/2011 | Hayashi | ............. | H01L 51/0003 257/40 |
| 2011/0300657 A1* | 12/2011 | Chesterfield | ........ | H01L 51/0003 438/46 |
| 2012/0067123 A1* | 3/2012 | Hattass | ............. | G01C 19/5726 73/504.12 |
| 2012/0252150 A1 | 10/2012 | Hiroki et al. | | |
| 2013/0207097 A1* | 8/2013 | Kai | ..................... | H01L 51/0067 257/40 |
| 2013/0334512 A1* | 12/2013 | Abe | .................... | C08G 73/026 257/40 |

FOREIGN PATENT DOCUMENTS

| | | |
|---|---|---|
| CN | 101383401 A | 3/2009 |
| CN | 102362338 A | 2/2012 |
| CN | 102807856 A | 12/2012 |
| CN | 103474584 A | 12/2013 |

OTHER PUBLICATIONS

Search Report issued in International Application No. PCT/CN2014/081117, dated Jun. 30, 2014 (Jun. 30, 2014).
Notification of the First Office Action dated May 29, 2015 corresponding to Chinese application No. 201310455386.0.
Written Opinion of the International Searching Authority dated Sep. 23, 2014 corresponding to International application No. PCT/CN2014/081117.

* cited by examiner

ORGANIC ELECTROLUMINESCENT DEVICE AND MANUFACTURING METHOD THEREOF, AND DISPLAY APPARATUS

This is a National Phase Application filed under 35 U.S.C 371 as a national stage of PCT/CN2014/081117, filed Jun. 30, 2014, an application claiming the benefit to Chinese Application No. 201310455386.0, filed Sep. 29, 2013; the content of each of which is hereby incorporated by reference in its entirety.

FIELD OF THE INVENTION

The present invention relates to the field of display technology, in particular to an organic electroluminescent device and a manufacturing method thereof, and a display apparatus.

BACKGROUND OF THE INVENTION

The solution method for forming a function layer (such as a hole injection layer, a hole transporting layer, a light-emitting layer, an electron transporting layer, and an electron injection layer) of an organic electroluminescent device includes: the material of the function layer is first prepared to be a solution, the solution is then coated by spinning or spraying to form the function layer, and after that it is dried at room temperature. During the drying and film forming process for the function layer, solvent will be remained, which leads to a poor dense and non-uniform function layer, and easily results in defects, especially when the function layer is a light-emitting layer, host and guest molecules in a doped system are easy to aggregate, and cannot merge into each other well, so the energy transfer and the carrier transport capability between the host and guest materials are affected.

SUMMARY OF THE INVENTION

An object of the invention is to solve the problem that residual solvent and a defected function layer occur when the existing solution method is used to manufacture the function layer of the organic electroluminescent device, and provide a method for manufacturing the organic electroluminescent device.

The technical solution employed to solve the above technical problem is a method for manufacturing an organic electroluminescent device, including using the following to form at least one function layer: preparing a solution of a material of the function layer, and forming a liquid material layer for the function layer using the solution of the material of the function layer; performing a vacuum drying on the liquid material layer for the function layer to form the function layer.

Compared to the drying at room temperature, when a vacuum drying is performed, since the organic solvent molecules are more vigorous when being heated, the solvent is easily volatile; at the same time, the vacuum conditions are more advantageous in volatilizing and extracting the organic solvent molecules, so that the organic solvent can be rapidly cleared, and can be cleared relatively completely. The light-emitting layer film subjected to the vacuum drying at a constant temperature is relatively dense, and the residual organic solvent can be effectively removed, and defects are prevented from forming, which makes the film become smooth and dense, enhances the carrier mobility in the film, and is advantageous to the transport and recombination of electrons and holes.

Preferably, the vacuum drying is performed at a constant temperature.

Preferably, the process time that the vacuum drying is performed is divided into a plurality of periods of time, the vacuum drying is performed at a constant temperature in each period of time, and a temperature at which the vacuum drying is performed in at least one period of time among the plurality of periods of time is different from those in other periods of time.

Further preferably, the temperature at which the vacuum drying is performed is in the range from 70° C. to 150° C.

Preferably, the process time that the vacuum drying is performed is in the range from 10 min to 20 min.

Preferably, the at least one function layer includes one or more of a hole injection layer, a hole blocking layer, a light-emitting layer, an electron transporting layer, and an electron injection layer.

Preferably, the function layer includes a light-emitting layer, and components of the solution of the light-emitting layer include a metal complex as a phosphorescent material and a host material.

Further preferably, the metal complex as a phosphorescent material is an iridium complex; and the iridium complex is any one of tris(2-phenylpyridine) iridium, 2-(4-tolyl) pyridine iridium, benzo quinoline iridium.

Further preferably, the host material is any one of m-bis(N-carbazolyl)benzene, polyvinyl carbazole, 1,2,4-triazole, N,N'-bis(1-naphthyl)-N,N'-diphenyl-1,1'-biphenyl-4-4'-diamine, and coal-based polyaniline.

Another object of the invention aims at the poor luminous performance of the existing organic electroluminescent device due to the residual solvent and the defected function layer in the manufacturing procedure, and provides an organic electroluminescent device with a good luminous performance, wherein the organic electroluminescent device is manufactured by the above method for manufacturing an organic electroluminescent device.

Another object of the invention is to provide a display apparatus which has high luminous efficiency and long lifetime, and the display apparatus includes the above organic electroluminescent device.

In the method for manufacturing the organic electroluminescent device of the present invention, a relatively dense function layer film is formed by performing a vacuum drying on the liquid material layer for the function layer, and the residual organic solvent is effectively removed to avoid the formation of defects, so that the function layer film becomes smooth and dense, which increases the carrier mobility in the film and is advantageous to the transport and recombination of electrons and holes; especially when the function layer is a light-emitting layer, host and guest molecules in a doped system can merge into each other well to increase the energy transfer and the carrier transport capability between the host and guest materials, and further improve the luminous performance and the lifetime of the organic electroluminescent device and the display apparatus including the organic electroluminescent device.

DETAILED DESCRIPTION OF THE EMBODIMENTS

In order to make persons skilled in the art better understand the technical solutions of the invention, the invention will be further described in detail below in conjunction with the drawings and the particular implementations.

Comparison embodiment

The present comparison embodiment provides a method for manufacturing an organic electroluminescent device, including forming a function layer of the organic electroluminescent device using the solution method. The present comparison embodiment is described by taking using the solution method to form the light-emitting layer as an example, and includes the following steps:

1. Preparation of the Solution of the Material of the Light-Emitting Layer

In a nitrogen-atmosphere glovebox, m-bis(N-carbazolyl)benzene as the host material and tris(2-phenylpyridine) iridium as the guest material are weighed, and are dissolved in the organic solvent of tetrachloromethane, respectively, and the two prepared solutions are mixed with 5% of the mass percentage of tris(2-phenylpyridine) iridium versus m-bis(N-carbazolyl)benzene, so as to prepare the solution of the material of the light-emitting layer.

2. Preparation of the Light-Emitting Layer

The indium tin oxide conductive glass with a specific pattern formed by lithography is cleaned and dried, and fixed on the spin coater; the prepared solution of the material of the light-emitting layer is uniformly coated throughout the surface of the indium tin oxide conductive glass, and is spin coated at the speed of 2000 rpm for 50 s, and a liquid material layer for the light-emitting layer of 20 nm thickness is formed on the surface of the indium tin oxide conductive glass; in a nitrogen environment, the indium tin oxide conductive glass is placed into a drying box to be dried at ordinary temperatures to complete the preparation of the light-emitting layer.

Figure 1:
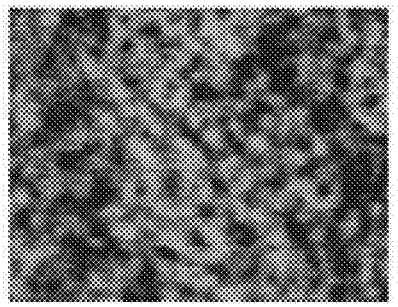
FIG. 1 is a diagram illustrating a test result of a light-emitting layer formed by a comparison embodiment of the invention in an atomic force microscope test.
Figure 3:
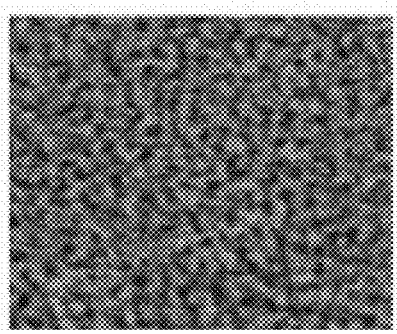
FIG. 3 is a phase diagram illustrating the light-emitting layer formed by the comparison embodiment of the invention in an atomic force microscope test.

The prepared light-emitting layer film is tested by an atomic force microscope, and the test results are shown in FIGS. 1 and 3.

Then the other function layers are prepared, for example, transferring to a metal cavity to perform cathode evaporation. The method for preparing the other function layers belongs to the existing techniques, and will not be elaborated.

Figure 5:
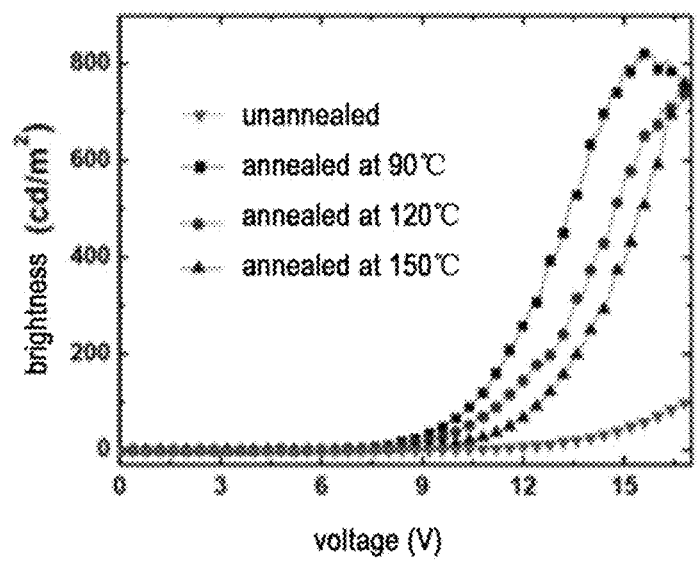
FIG. 5 is a diagram illustrating test results of brightness versus voltage of the light-emitting layers formed by Embodiments 1 to 3 and the comparison embodiment of the invention.
Figure 6:
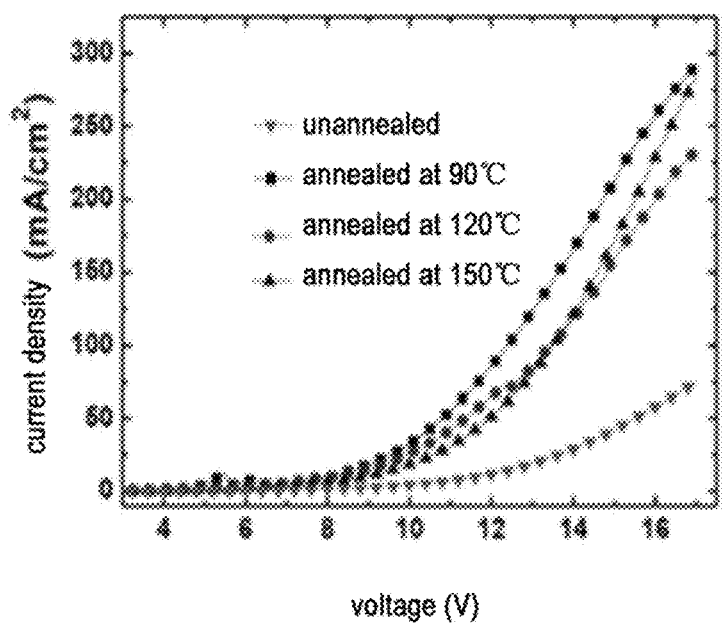
FIG. 6 is a diagram illustrating test results of current density versus voltage of the light-emitting layers formed by Embodiments 1 to 3 and the comparison embodiment of the invention.

The prepared organic electroluminescent device is tested for luminous performance, and the test results are shown in FIGS. 5 and 6.

Optionally, other essential parts of the display apparatus are prepared, to form the display apparatus, and the method for preparing the other essential parts of the display apparatus belongs to the existing techniques, and will not be elaborated.

Embodiment 1

The present embodiment provides a method for manufacturing an organic electroluminescent device, including forming a function layer of the organic electroluminescent device using the solution method. The present embodiment is described by taking using the solution method to form the light-emitting layer as an example, and includes the following steps:

1. Preparation of the Solution of the Material of the Light-Emitting Layer

In a nitrogen-atmosphere glovebox, m-bis(N-carbazolyl)benzene as the host material and tris(2-phenylpyridine) iridium as the guest material are weighed, and are dissolved in the organic solvent of tetrachloromethane, respectively, and the two prepared solutions are mixed with 5% of the mass percentage of tris(2-phenylpyridine) iridium versus m-bis(N-carbazolyl)benzene, so as to prepare the solution of the material of the light-emitting layer.

2. Preparation of the Light-Emitting Layer

The indium tin oxide conductive glass with a specific pattern formed by lithography is cleaned and dried, and fixed on the spin coater; the prepared solution of the material of the light-emitting layer is uniformly coated throughout the surface of the indium tin oxide conductive glass, and is spin coated at the speed of 2000 rpm for 50 s, and a liquid material layer for the light-emitting layer of 20 nm thickness is formed on the surface of the indium tin oxide conductive glass; in a nitrogen environment, the indium tin oxide conductive glass is placed into the vacuum drying box to be dried at a constant temperature of 90° C. for 10 min to complete the preparation of the light-emitting layer.

Figure 2:
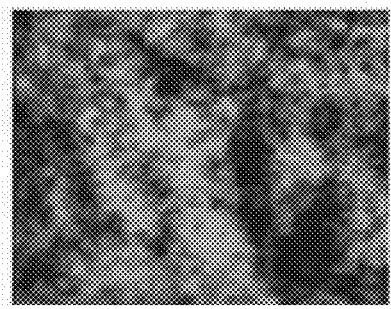
FIG. 2 is a diagram illustrating a test result of a light-emitting layer formed by Embodiment 1 of the invention in an atomic force microscope test.
Figure 4:
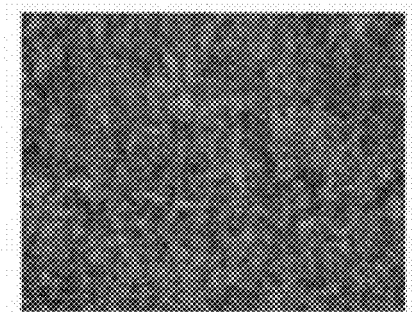
FIG. 4 is a phase diagram illustrating the light-emitting layer formed by Embodiment 1 of the invention in an atomic force microscope test.

The prepared light-emitting layer film is tested by an atomic force microscope (AFM), and the results are shown in FIGS. 2 and 4. It can be known that, by comparing FIG. 1 with FIG. 2, compared to the comparison embodiment (that is, vacuum drying at a constant temperature versus drying at ordinary temperatures), since the organic solvent molecules are more vigorous when being heated (90° C.) and easily volatile; at the same time, the vacuum conditions are more advantageous in volatilizing and extracting the organic solvent molecules, so that the organic solvent can be rapidly cleared, and can be cleared relatively completely. The light-emitting layer film subjected to the vacuum drying at a constant temperature is relatively dense, and the residual organic solvent can be effectively removed, and defects are prevented from forming, which makes the film become smooth and dense, enhances the carrier mobility in the film, and is advantageous to the transport and recombination of electrons and holes.

It can be known that, by comparing FIG. 3 with FIG. 4, after the light-emitting layer film is subjected to vacuum drying at a constant temperature, host and guest molecules can merge into each other better, which facilitates formation of an organic electroluminescent device with a better performance.

Then the other function layers are prepared, for example, transferring to the metal cavity to perform cathode evaporation. The method for preparing the other function layers belongs to the existing techniques, and will not be elaborated.

The prepared organic electroluminescent device is tested for luminous performance, and the results are shown in FIGS. 5 and 6.

It can be seen from FIG. 5 that, at the same voltage, compared to the comparison embodiment (marked as unannealed in the figure), the organic electroluminescent device manufactured by being subject to a vacuum drying at a constant temperature of the present embodiment (marked as annealed at 90 degree) has a higher brightness, indicating that the annealing treatment improves the luminous efficiency of the light-emitting layer, and improves the luminescent performance of the light-emitting layer.

It can be seen from FIG. 6 that, at the same voltage, compared to the comparison embodiment (marked as unannealed in the figure), the organic electroluminescent device manufactured by being subject to a vacuum drying at a constant temperature of the present embodiment (marked as annealed at 90 degree) has a larger current density, indicating that the annealing treatment improves the carrier transport performance of the light-emitting layer, and enhances mergence of host and guest molecules.

Optionally, other essential parts of the display apparatus are prepared, to form the display apparatus, and the method for preparing the other essential parts of the display apparatus belongs to the existing techniques, and will not be elaborated.

Embodiment 2

The present embodiment provides a method for manufacturing an organic electroluminescent device, including forming a function layer of the organic electroluminescent device using the solution method. The present embodiment is described by taking using the solution method to form the light-emitting layer as an example, and includes the following steps:

1. Preparation of the Solution of the Material of the Light-Emitting Layer

In a nitrogen-atmosphere glovebox, m-bis(N-carbazolyl)benzene as the host material and tris(2-phenylpyridine) iridium as the guest material are weighed, and are dissolved in the organic solvent of tetrachloromethane, respectively, and the above two solutions are mixed with 5% of the mass percentage of tris(2-phenylpyridine) iridium versus m-bis(N-carbazolyl)benzene, so as to prepare the solution of the material of the light-emitting layer.

2. Preparation of the Light-Emitting Layer

The indium tin oxide conductive glass with a specific pattern formed by lithography is cleaned and dried, and fixed on the spin coater; the prepared solution of the material of the light-emitting layer is uniformly coated throughout the surface of the indium tin oxide conductive glass, and is spin coated at the speed of 2000 rpm for 50 s, and a liquid material layer for the light-emitting layer of 20 nm thickness is formed on the surface of the indium tin oxide conductive glass; in a nitrogen environment, the indium tin oxide conductive glass is placed into the vacuum drying box to be dried at a constant temperature of 120° C. for 10 min to complete the preparation of the light-emitting layer.

Then the other function layers are prepared, for example, transferring to the metal cavity to perform cathode evaporation. The method for preparing the other function layers belongs to the existing techniques, and will not be elaborated.

The prepared organic electroluminescent device is tested for luminous performance, and the results are shown in FIGS. 5 and 6.

It can be seen from FIG. 5 that, at the same voltage, compared to the comparison embodiment (marked as unannealed in the figure), the organic electroluminescent device manufactured by being subject to a vacuum drying at a constant temperature of the present embodiment (marked as annealed at 120 degree) has a higher brightness, indicating that the annealing treatment improves the luminous efficiency of the light-emitting layer, and improves the luminescent performance of the light-emitting layer.

It can be seen from FIG. 6 that, at the same voltage, compared to the comparison embodiment (marked as unannealed in the figure), the organic electroluminescent device manufactured by being subject to a vacuum drying at a constant temperature of the present embodiment (marked as annealed at 120 degree) has a larger current density, indicating that the annealing treatment improves the carrier transport performance of the light-emitting layer, and enhances mergence of host and guest molecules.

Optionally, other essential parts of the display apparatus are prepared, to form the display apparatus, and the method for preparing the other essential parts of the display apparatus belongs to the existing techniques, and will not be elaborated.

Embodiment 3

The present embodiment provides a method for manufacturing an organic electroluminescent device, including forming the function layer of the organic electroluminescent device using the solution method. The present embodiment is described by taking using the solution method to form the light-emitting layer as an example, and includes the following steps:

1. Preparation of the Solution of the Material of the Light-Emitting Layer

In a nitrogen-atmosphere glovebox, m-bis(N-carbazolyl) benzene as the host material and tris(2-phenylpyridine) iridium as the guest material are weighed, and are dissolved in the organic solvent of tetrachloromethane, respectively, and the above two solutions are mixed with 5% of the mass percentage of tris(2-phenylpyridine) iridium versus m-bis (N-carbazolyl)benzene, so as to prepare the solution of the material of the light-emitting layer.

2. Preparation of the Light-Emitting Layer

The indium tin oxide conductive glass with a specific pattern formed by lithography is cleaned and dried, and fixed on the spin coater; the prepared solution of the material of the light-emitting layer is uniformly coated throughout the surface of the indium tin oxide conductive glass, and is spin coated at the speed of 2000 rpm for 50 s, and a liquid material layer for the light-emitting layer of 20 nm thickness is formed on the surface of the indium tin oxide conductive glass; in a nitrogen environment, the indium tin oxide conductive glass is placed into the vacuum drying box to be dried at a constant temperature of 150° C. for 10 min to complete the preparation of the light-emitting layer.

Then the other function layers are prepared, for example, transferring to the metal cavity to perform cathode evaporation. The method for preparing the other function layers belongs to the existing techniques, and will not be elaborated.

The prepared organic electroluminescent device is tested for luminous performance, and the results are shown in FIGS. 5 and 6.

It can be seen from FIG. 5 that, at the same voltage, compared to the comparison embodiment (marked as unannealed in the figure), the organic electroluminescent device manufactured by being subject to a vacuum drying at a constant temperature of the present embodiment (marked as annealed at 150 degree) has a higher brightness, indicating that the annealing treatment improves the luminous efficiency of the light-emitting layer, and improves the luminescent performance of the light-emitting layer.

It can be seen from FIG. 6 that, at the same voltage, compared to the comparison embodiment (marked as unannealed in the figure), the organic electroluminescent device manufactured by being subject to a vacuum drying at a constant temperature of the present embodiment (marked as annealed at 150 degree) has a larger current density, indicating that the annealing treatment improves the carrier transport performance of the light-emitting layer, and enhances mergence of host and guest molecules.

Optionally, other essential parts of the display apparatus are prepared, to form the display apparatus, and the method for preparing the other essential parts of the display apparatus belongs to the existing techniques, and will not be elaborated.

In the invention, when the light-emitting layer film is prepared by the solution method, the liquid material layer for the function layer is performed a vacuum drying at a constant temperature, so as to remove the residual solvent to avoid defects occurring in the function layer, and thus the problem that the film prepared by the solution method is not dense and uneven; especially when the function layer is a light-emitting layer, host and guest molecules in a doped system can merge into each other well to increase the energy transfer and the carrier transport capability between the host and guest materials, and further improve the carrier transport performance and the luminous performance the organic electroluminescent device, and in turn elongate the lifetime of the device.

Embodiment 4

The present embodiment provides a method for manufacturing an organic electroluminescent device, including forming respective function layers of the organic electroluminescent device using the solution method. The present embodiment is described by taking using the solution method to form a hole injection layer, a hole transporting layer, a light-emitting layer, an electron transporting layer, and an electron injection layer as an example, and includes the following steps:

Step 1, Preparation of the Hole Injection Layer 1.1 Preparation of the Solution of the Material of the Hole Injection Layer In a nitrogen-atmosphere glovebox, poly(3,4-ethylendioxythiophene) doped with polystyrene sulfonic acid is weighed, and is dissolved in the organic solvent of tetrachloromethane, and the mixed solution of the material of the hole injection layer has a mass concentration of 10 mg/ml.

1.2 Preparation of the Hole Injection Layer

The indium tin oxide conductive glass with a specific pattern formed by lithography is cleaned and dried, and fixed on the spin coater; the prepared solution of the material of the hole injection layer is uniformly coated throughout the surface of the indium tin oxide conductive glass, and is spin coated at the speed of 2300 rpm for 50 s, and a liquid material layer for the hole injection layer of 23 nm thickness is formed on the surface of the indium tin oxide conductive glass; in a nitrogen environment, the indium tin oxide conductive glass is placed into the vacuum drying box to be dried at a constant temperature of 70° C. for 14 min to complete the preparation of the hole injection layer.

Step 2, Preparation of the Hole Transporting Layer 2.1 Preparation of the Solution of the Material of the Hole Transporting Layer In a nitrogen-atmosphere glovebox, poly N,N'-bis(1-naphthyl)-N,N'-diphenyl-1,1'-biphenyl-4-4'-diamine is weighed, and is dissolved in the organic solvent of chlorobenzene and the mixed solution of the material of the hole transporting layer has a mass concentration of 15 mg/ml.

2.2 Preparation of the Hole Transporting Layer

The conductive glass with the hole injection layer prepared in Step 1 is fixed on the spin coater; the prepared solution of the material of the hole transporting layer is uniformly coated throughout the hole injection layer of the conductive glass, and is spin coated at the speed of 2200 rpm for 60 s, and a liquid material layer for the hole transporting layer of 28 nm thickness is formed on the surface of the hole injection layer; in a nitrogen environment, the conductive glass is placed into the vacuum drying box to be dried at a constant temperature of 110° C. for 13 min to complete the preparation of the hole transporting layer.

Step 3, Preparation of the Light-Emitting Layer 3.1 Preparation of the Solution of the Material of the Light-Emitting Layer In a nitrogen-atmosphere glovebox, N,N'-bis(1-naphthyl)-N,N'-diphenyl-1,1'-biphenyl-4-4'-diamine as the host material and 2-(4-tolyl) pyridine iridium as the guest material are weighed, and are dissolved in the organic solvent of tetrachloromethane, respectively, and the two prepared solutions are mixed with 16% of the mass percentage of 2-(4-tolyl) pyridine iridium versus N,N'-bis(1-naphthyl)-N,N'-diphenyl-1,1'-biphenyl-4-4'-diamine, so as to prepare the solution of the material of the light-emitting layer.

3.2 Preparation of the Light-Emitting Layer

The conductive glass with the hole transporting layer prepared in Step 2 is fixed on the spin coater; the prepared solution of the material of the light-emitting layer is uniformly coated throughout the hole transporting layer of the conductive glass, and is spin coated at the speed of 2800 rpm for 52 s, and a liquid material layer for the light-emitting layer of 30 nm thickness is formed on the surface of the hole transporting layer; in a nitrogen environment, the conductive glass is placed into the vacuum drying box to be dried at a constant temperature of 100° C. for 20 min to complete the preparation of the light-emitting layer.

Step 4, Preparation of the Electron Transporting Layer 4.1 Preparation of the Solution of the Material of the Electron Transporting Layer In a nitrogen-atmosphere glovebox, 8-hydroxyquinoline aluminum is weighed, and is dissolved in the organic solvent of tetrahydrofuran and the mixed solution of the material of the electron transporting layer has a mass concentration of 18 mg/ml.

4.2 Preparation of the Electron Transporting Layer

The conductive glass with the light-emitting layer prepared in Step 3 is fixed on the spin coater; the prepared solution of the material of the electron transporting layer is uniformly coated throughout the light-emitting layer, and is spin coated at the speed of 2000 rpm for 55 s, and a liquid material layer for the electron transporting layer of 24 nm thickness is formed on the surface of the light-emitting layer; in a nitrogen environment, the conductive glass is placed into the vacuum drying box to be dried at a constant temperature of 90° C. for 19 min to complete the preparation of the electron transporting layer.

Step 5, Preparation of the Electron Injection Layer 5.1 Preparation of the Solution of the Material of the Electron Injection Layer In a nitrogen-atmosphere glovebox, 8-hydroxyquinoline lithium is weighed, and is dissolved in the organic solvent of chlorobenzene and the mixed solution of the material of the electron injection layer has a mass concentration of 5 mg/ml.

5.2 Preparation of the Electron Injection Layer

The conductive glass with the electron transporting layer prepared in Step 4 is fixed on the spin coater; the prepared solution of the material of the electron injection layer is uniformly coated throughout the electron transporting layer, and is spin coated at the speed of 2500 rpm for 60 s, and a liquid material layer for the electron injection layer of 20 nm thickness is formed on the electron transporting layer; in a nitrogen environment, the conductive glass is placed into the vacuum drying box to be dried at a constant temperature of 150° C. for 10 min to complete the preparation of the electron injection layer.

Then the other function layers are prepared, for example, transferring to the metal cavity to perform cathode evaporation. The method for preparing the other function layers belongs to the existing techniques, and will not be elaborated.

It should be understood that, as for the above function layers, one or several can be selected therefrom depending on a specific application. The spin coating in the above solution method may also be replaced by spraying. As for the solutions of the materials of the respective function layers, one can select the other components in the prior art according to the specific application. For example, the host material of the solution for the light-emitting layer may be coal-based polyaniline, and the guest material may be benzo quinoline iridium, and benzo quinoline iridium and coal-based polyaniline are mixed with 18% of the mass percentage of benzo quinoline iridium versus coal-based polyaniline, to prepare the solution of the material of the light-emitting layer; the solution of the material of the electron transporting layer may be a solution of tetrahydrofuran in which 4,7-diphenyl-1,10-Phenanthroline monohydrate is dissolved, and the solution has a mass concentration of 20 mg/ml.

Optionally, other essential parts of the display apparatus are prepared, to form the display apparatus, and the method for preparing the other essential parts of the display apparatus belongs to the existing techniques, and will not be elaborated.

It should be understood that, in the invention, the temperature at which the vacuum drying is performed may be adjusted according to the property of the material of the function layer to be processed; in addition, the drying within a range from 70° C. to 150° C. may be performed at stages, and at each stage, the drying is performed at a constant temperature, for example, the drying is performed at 130° C. for a period of time, then is performed at 110° C. for a period of time, and then is performed at 90° C. for a period of time, and so on, which range should belong to the scope of the present invention.

It should be understood that, the above embodiments are just exemplary embodiments for illustrating the principle of the present invention. However, the present invention is not limited thereto. Various variations and improvements can be made by a person skilled in the art without departing from the spirit and essence of the present invention, and these variations and improvements should also be considered to be within the protection scope of the present invention.

The invention claimed is:

1. A method for manufacturing an organic electroluminescent device, including using the following to form at least one function layer:

preparing a solution of a material of the function layer, and forming a liquid material layer for the function layer using the solution of the material of the function layer; and performing a vacuum drying on the liquid material layer for the function layer to form the function layer;

wherein the process time that the vacuum drying is performed is divided into a plurality of periods of time, the vacuum drying is performed at a constant temperature in each period of time, and a temperature at which the vacuum drying is performed in at least one period of time among the plurality of periods of time is different from those in other periods of time, wherein the vacuum drying is performed within a range from 70° C. to 150° C., and the vacuum drying is performed at least at 130° C. for a period of time, then is performed at 110° C. for a period of time, and then is performed at 90° C. for a period of time, so that organic solvent included in the liquid material layer for the function layer are rapidly removed.

2. The method for manufacturing an organic electroluminescent device of claim 1, the process time that the vacuum drying is performed is in the range from 10 min to 20 min.

3. The method for manufacturing an organic electroluminescent device of claim 1, wherein the at least one function layer includes one or more of a hole injection layer, a hole blocking layer, an electron transporting layer, and an electron injection layer.

4. The method for manufacturing an organic electroluminescent device of claim 1, wherein the at least one function layer includes a light-emitting layer, or a light-emitting layer and one or more of a hole injection layer, a hole blocking layer, an electron transporting layer, and an electron injection layer.

5. The method for manufacturing an organic electroluminescent device of claim 4, wherein components of the solution of the light-emitting layer include a metal complex as a phosphorescent material and a host material.

6. The method for manufacturing an organic electroluminescent device of claim 5, wherein the metal complex as a phosphorescent material is an iridium complex; and the iridium complex is any one of tris(2- phenylpyridine) iridium, 2-(4-tolyl) pyridine iridium, and benzo quinoline iridium.

7. The method for manufacturing an organic electroluminescent device of claim 5, wherein the host material is any one of m-bis(N-carbazolyl)benzene, polyvinyl carbazole, 1,2,4-triazole, N,N'-bis(1-naphthyl)-N,N'-diphenyl-1,1'-biphenyl -4-4'-diamine, coal-based polyaniline.

8. The method for manufacturing an organic electroluminescent device of claim 6, wherein the host material is any one of m-bis(N-carbazolyl)benzene, polyvinyl carbazole, 1,2,4-triazole, N,N'-bis(1-naphthyl)-N,N'-diphenyl-1,1'-biphenyl -4-4'-diamine, coal-based polyaniline.

9. An organic electroluminescent device, which is manufactured by the method for manufacturing an organic electroluminescent device of claim 1.

10. A display device, including the organic electroluminescent device of claim 9.

* * * * *